United States Patent
Kuzuya et al.

(10) Patent No.: US 7,842,393 B2
(45) Date of Patent: Nov. 30, 2010

(54) VEHICLE ANTIFOGGING ELEMENT

(75) Inventors: Norihiko Kuzuya, Fujieda (JP); Masatoshi Nakamura, Fujieda (JP)

(73) Assignee: Murakami Corporation, Shizuoka-shi (JP)

( * ) Notice: Subject to any disclaimer, the term of this patent is extended or adjusted under 35 U.S.C. 154(b) by 368 days.

(21) Appl. No.: 11/949,296

(22) Filed: Dec. 3, 2007

(65) Prior Publication Data

US 2008/0261031 A1    Oct. 23, 2008

(30) Foreign Application Priority Data

Dec. 27, 2006    (JP) .............................. 2006-352186

(51) Int. Cl.
    *B32B 9/00*    (2006.01)
(52) U.S. Cl. ....................... 428/426; 428/428; 428/432; 428/469; 428/472; 428/701
(58) Field of Classification Search .................. None
    See application file for complete search history.

(56) References Cited

U.S. PATENT DOCUMENTS 5,854,708 A * 12/1998 Komatsu et al. ............ 359/512
2005/0163924 A1* 7/2005 Anderson et al. ............ 427/166
2006/0020052 A1    1/2006 Tsujimoto et al.
2006/0266258 A1    11/2006 Asakura et al.

FOREIGN PATENT DOCUMENTS

| EP | 1 522 342 A1 | 4/2005 |
| JP | 62-68547 | 3/1987 |
| JP | 2001-342022 | 12/2001 |
| JP | 2005-28225 | 2/2005 |
| WO | WO 03/053577 A1 | 7/2003 |
| WO | WO 2004/026783 A1 | 4/2004 |

OTHER PUBLICATIONS

J. Nowotny, et al., "Titanium dioxide for solar-hydrogen I. Functional properties", International Journal of Hydrogen Energy, vol. 32, No. 14, XP022243289, ISSN: 0360-3199, Nov. 2006, pp. 2609-2629.

* cited by examiner

*Primary Examiner*—Timothy M Speer
(74) *Attorney, Agent, or Firm*—Oblon, Spivak, McClelland, Maier & Neustadt, L.L.P.

(57) ABSTRACT

The present invention provides a vehicle antifouling element that comprises a layer comprising a p-type semiconductor and a thin film that comprises an n-type semiconductor that is laminated on the surface of the p-type semiconductor layer. The thin film comprises a photocatalytic activity and the film thickness thereof is equal to or more than 5 nm and less than 60 nm.

15 Claims, 5 Drawing Sheets 12  24  26

US 7,842,393 B2

VEHICLE ANTIFOGGING ELEMENT

BACKGROUND OF THE INVENTION

1. Field of the Invention

The present invention relates to a vehicle antifouling element.

CROSS-REFERENCE TO RELATED APPLICATION

The disclosure of Japanese Patent Application No. JP2006-352186 filed on Dec. 27, 2006 including the specification, drawings and abstract is incorporated herein by reference in its entirety.

2. Description of the Related Art

Conventionally, in a vehicle member such as an automobile door mirror, a film-like antifouling element that prevents pollutants from the peripheral environment is known. Representative examples of element materials with such an antifouling function include photocatalysts such as titanium dioxide ($TiO_2$). Photocatalysts which are semiconductors generate electron and positive hole pairs within the photocatalyst when excited by light of a wavelength that possesses energy equal to greater than the band gap. The organic matter that adheres to the surface is removed through decomposition on the basis of an redox reaction of the electron and positive hole pairs thus generated.

Further, as means for improving the activation of a photocatalyst, Japanese Application Laid Open No. 2001-342022 has disclosed a method that uses laser ablation to grow an anatase-type $TiO_2$ single crystal on a $SrTiO_3$ single crystal substrate. In addition, International Publication pamphlet No. 03/053577 has disclosed a method for growing a $TiO_2$ film on a seed crystal layer such as monoclinic zirconium oxide. According to these patent documents, the fact that the photocatalytic activity improves as a result of suppressing the crystal defects by raising the crystallinity of the $TiO_2$ film is presented.

In addition, the Japanese Application Laid Open No. 62-68547 has proposed a semiconductor photocatalyst that comprises p-type and n-type film-like semiconductors with the intention of providing a semiconductor photocatalyst in which the light absorption efficiency increases and the reaction efficiency improves as a result of widening the light absorption region. In addition, Japanese Application Laid Open No. 2005-28225 discloses a photocatalyst material that joins a p-type semiconductor and an n-type semiconductor which are doped with nitrogen in which the band gap and carrier density are within a specified numerical range. This patent document shows that the photocatalytic activity is improved as a result of utilizing a semiconductor pn junction.

However, the present inventor discovered that, when conventional photocatalysts including those mentioned in each of the abovementioned documents were examined in detail, these conventional photocatalysts were not suitable for use as vehicle antifouling elements. That is, the $TiO_2$ with high crystallinity that was disclosed by Japanese Application Laid Open No. 2001-342022 was grown on an $SrTiO_3$ single crystal but the $SrTiO_3$ single crystal is not a general-purpose crystal and it is technically difficult to grow the $TiO_2$ single crystal on this base material. In addition, the $TiO_2$ film which appears in International Publication pamphlet No. 03/053577 has an inadequate antifouling effect and has scope for further improvement. Moreover, monoclinic zirconium oxide or similar which is the base material is costly and therefore not suited to mass production. Further, the photocatalytic films which have a lower layer that appear in Japanese Application Laid Open No. 62-68547 and Japanese Application Laid Open No. 2005-28225 both have a film thickness which is too thick at 60 nm or more and 130 nm or more. Such photocatalytic films more readily generate cracks when exposed to the variety of harsh environments to which vehicles are exposed (high temperatures, low temperatures, high humidity and so forth, for example) and cannot be said to have an adequate environmental durability and are difficult to apply to vehicle antifouling elements.

SUMMARY OF THE INVENTION

Therefore, the present invention was conceived in view of the above situation and an object of the present invention is to provide a vehicle antifouling element that adequately affords an antifouling effect and which possesses sufficiently high environmental resistance even when the photocatalyst forms that appear in Japanese Application Laid Open No. 2001-342022 and International Publication pamphlet No. 03/053577 are not adopted.

In order to achieve the above object, the present invention provides a vehicle antifouling element, comprising a layer comprising a p-type semiconductor; and a thin film comprising an n-type semiconductor that is laminated on the surface of the p-type semiconductor layer, wherein the thin film has a photocatalytic activity and the film thickness of the thin film is equal to or more than 5 nm and less than 60 nm.

With this vehicle antifouling element, the photocatalytic activity for the n-type semiconductor vehicle antifouling function can be adequately improved by creating a pn junction by laminating a layer comprising a p-type semiconductor and a thin film comprising an n-type semiconductor. This is presumed to be because, at the point where electron and positive hole pairs are generated upon irradiating the vehicle antifouling element of the present invention with excitation light such as ultraviolet light, the probability of the electrons and positive holes recombining can be reduced by means of the pn junction. Furthermore, because the photocatalytic activity is raised as a result of the pn junction, there is no need for the n-type semiconductor to be a single-crystal and there is also no need to use a costly material such as monoclinic zirconium oxide as the base material. Therefore, the vehicle antifouling element is adequately superior in its general versatility and mass productivity. In addition, by making the film thickness of the thin film comprising the n-type semiconductor equal to or more than 5 nm and less than 60 nm, cracks do not readily occur even when the thin film is exposed to the various harsh environments in which a vehicle is placed. As a result, it is possible to adequately increase the environmental resistance of the vehicle antifouling element of the present invention. An adequate photocatalytic activity for the vehicle antifouling element can be maintained as long as the film thickness of the thin film falls within this range.

Since the film thickness of the thin film is thin in comparison with the prior art, additional cost reductions can be achieved. In addition, in the case of the vehicle antifouling element of the present invention, warpage and bending of the layer can be suppressed by keeping the film thickness of the thin film equal to or more than 5 nm and less than 60 nm.

According to the vehicle antifouling element of the present invention, the n-type semiconductor is preferably titanium dioxide. As a result, the photocatalytic activity for the vehicle antifouling function can be improved further.

In addition, in the vehicle antifouling element of the present invention, the p-type semiconductor preferably exhibits photodissolution. Here, 'photodissolution' means a quality where the semiconductor itself causes oxidation dissolution as a result of the positive holes which are produced when excitation light such as ultraviolet light are irradiated onto the semiconductor in the presence of moisture and or organic solvent. The vehicle antifouling element is normally exposed to an environment where moisture is present and, therefore, undergoes oxidation dissolution when same comprises a p-type semiconductor with photodissolution as a material property. Thus, because the photocatalytic activity of an n-type semiconductor drops dramatically, n-type semiconductors do not apply as vehicle antifouling elements.

In the vehicle antifouling element of the present invention, a hydrophilic inorganic oxide film is preferably also laminated on the surface on the opposite side from the thin-film layer. By providing a hydrophilic inorganic oxide film, the vehicle antifouling element is able to exhibit more preferable antifogging properties and visibility. In addition, the vehicle antifouling element is able to exhibit superior durability because, even in cases where organic contaminants, which reduces the hydrophilic function, has adhered thereto, the organic contaminants that has adhered to the vehicle antifouling element decomposes as a result of the photocatalytic action of the n-type semiconductor of the thin film. By providing an inorganic oxide film that exhibits high antifogging properties and a thin film that exhibits a high antifouling property separately, the vehicle antifouling element is able to maintain favorable antifogging properties for long periods.

The present invention makes it possible to provide a vehicle antifouling element that adequately affords an antifouling effect and which possesses sufficiently high environmental resistance.

DESCRIPTION OF THE PREFERRED EMBODIMENTS

Figure 1:
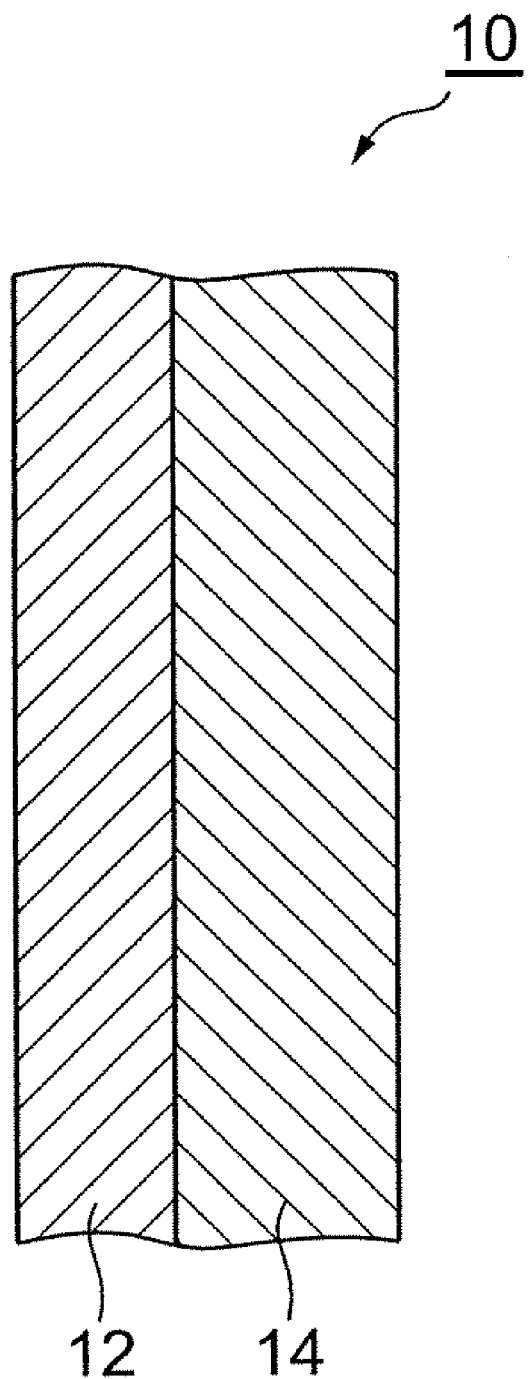
FIG. 1 is a schematic cross-sectional view of the vehicle antifouling element according to a first embodiment.

Preferred embodiments of the present invention will be described in detail hereinbelow with reference to the drawings as required. The same reference numerals are assigned to the same elements in the drawings and repetitive descriptions are avoided. The vertical and lateral positional relationships and so forth between the elements are not particularly limited and are based on the positional relationships shown in the drawings. The dimensional proportions of the drawings are not limited to the proportions illustrated here.

FIG. 1 is a schematic cross-sectional view of the vehicle antifouling element according to a preferred first embodiment of the present invention. The vehicle antifouling element 10 shown in FIG. 1 comprises a substrate 14 which comprises a p-type semiconductor and a thin film 12 which comprises an n-type semiconductor that is laminated on the surface of the substrate 14.

In this vehicle antifouling element 10, the substrate 14 also functions as the base material when the thin film 12 is formed.

As long as the constituent material of the substrate 14 is a p-type semiconductor, there are no particular limitations on the constituent material and the constituent material may also contain a widely known dopant in order to establish a more effective action as a p-type semiconductor. Constituent materials of the substrate 14 include, for example, polycrystalline or single-crystal silicon, nickel oxide, iron oxide, chromium oxide, molybdenum oxide, lithium-doped nickel oxide, copper-aluminum composite oxide, and copper-gallium composite oxide. Of these compounds, polycrystalline or single-crystal silicon, nickel oxide, lithium-doped nickel oxide, copper-aluminum composite oxide, or copper-gallium composite oxide are preferable for ease of use as base materials. In addition, single-crystal silicon can exhibit a rapid antifouling action on a vehicle antifouling element because the thin film 12 can be granted a highly superior photocatalytic activity in cases where $TiO_2$ are adopted as constituent materials of the thin film 12 (described subsequently).

The p-type semiconductor will preferably not exhibit photodissolution. As a result, a phenomenon whereby the substrate 14 undergoes oxidation dissolution in the presence of moisture and the photocatalytic activity of the thin film 12 drops can be effectively prevented. P-type semiconductors which exhibit photodissolution include zinc oxide (ZnO), cadmium sulfide (CdS), cadmium selenide (CdSe), and zinc sulfide (ZnS). Hence, it is suitable to exclude such compounds from the p-type semiconductors.

The thin film 12 has an n-type semiconductor as the constituent material and has photocatalytic activity. As long as the constituent material of the thin film 12 has adequate photocatalytic activity, there are no particular limitations thereon. Such constituent materials include, for example, titanium dioxide ($TiO_2$), strontium titanate ($SrTiO_3$), tungsten oxide ($WO_3$), niobium oxide (NbO), indium oxide ($In_2O_3$), tantalum oxide ($Ta_2O_5$), and tin oxide ($SnO_2$). Among these oxides, $TiO_2$, $SrTiO_3$, and $WO_3$ are preferable and $TiO_2$ is more preferable from the perspective of particularly high photocatalytic activity and their superior general versatility and mass productivity. In addition, the thin film 12 may also contain a widely known dopant in order to effectively act as an n-type semiconductor.

The film thickness of the thin film 12 is equal to or more than 5 nm and less than 60 nm. By making the film thickness equal to or more than 5 nm, in comparison with a case where the film thickness is less than 5 nm, the photocatalytic activity improves and the antifouling effect of the vehicle antifouling element can be adequately exhibited. In addition, when the film thickness is less than 60 nm, in comparison with cases where the film thickness is equal to or more than 60 nm, the internal stress of the thin film 12 is small and, therefore, the generation of cracks is suppressed and the thin film 12 is able to exhibit adequate environmental resistance.

Figure 2:
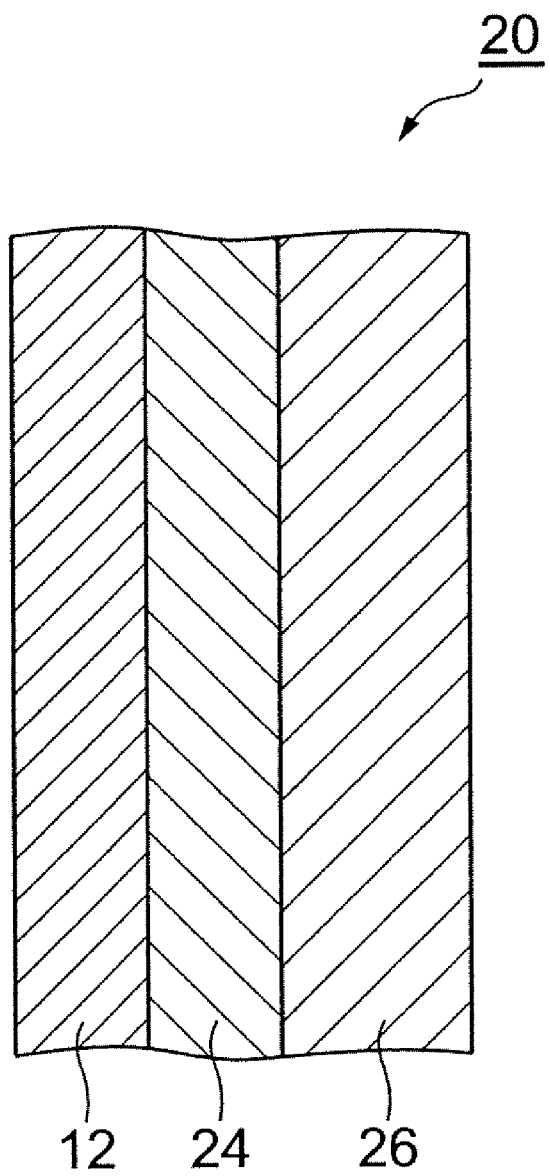
FIG. 2 is a schematic cross-sectional view of the vehicle antifouling element according to a second embodiment.

FIG. 2 is a schematic cross-sectional view that exhibits a vehicle antifouling element according to the preferred second embodiment of the present invention. The vehicle antifouling element 20 shown in FIG. 2 comprises a base material 26, a first thin film 24 constituting a layer comprising a p-type semiconductor which is formed on the surface of the base material 26, and a second thin film 12 comprising an n-type semiconductor which is laminated on the surface of the first thin film 24. In the vehicle antifouling element 20, the second thin film 12 is identical to the thin film 12 according to the first embodiment and, therefore, a description thereof is omitted here.

The base material 26 is provided in order to laminate the first thin film 24 and second thin film 12 on the surface in that order. Constituent materials of the base material 26 include, for example, glass such as soda-lime glass or quartz glass, and metal sheets of stainless steel or titanium. The base material 26 may be constituted by laminating a plurality of substrates. However, in cases where the base material 26 is provided in an optical member such as a vehicle mirror, the base material 26 is preferably transparent to visible light or ultraviolet light.

As long as the constituent material of the first thin film 24 is a p-type semiconductor, there are no particular limitations on the constituent material and the constituent material may also contain a widely known dopant in order to establish a more effective action as a p-type semiconductor. Possible constituent materials for the first thin film 24 include, for example, nickel oxide, iron oxide, chromium oxide, molybdenum oxide, lithium-doped nickel oxide, copper-aluminum composite oxide, and copper-gallium composite oxide. Of these compounds, nickel oxide, lithium-doped nickel oxide, copper-aluminum composite oxide, or copper-gallium composite oxide are preferable and nickel oxide is particularly preferable from the perspective of low material costs and straightforward deposition.

The p-type semiconductor preferably does not exhibit photodissolution as in the case of the first embodiment and, more specifically, the following are preferably excluded from usage: zinc oxide (ZnO), cadmium sulfide (CdS), cadmium selenide (CdSe), and zinc sulfide (ZnS).

A preferable film thickness for the first thin film 24 is 5 to 50 nm and, more preferably, 5 to 30 nm. When the film thickness is less than the lower limit value, there is the tendency for reduced action as a p-type semiconductor.

The vehicle antifouling element 20 according to the second embodiment comprises a base material 26 which is separate from the first thin film 24 which acts as a p-type semiconductor. That is, unlike the first embodiment, because the base material 26 does not require a p-type semiconductor function, a constituent material which corresponds with the application can be adopted as the base material 26. For example, in cases where the vehicle antifouling element 20 is provided in a vehicle mirror, a constituent material which is transparent to visible light and ultraviolet light such as glass can be used as mentioned earlier. Furthermore, in cases where the vehicle antifouling element 20 is provided in a ranging system of an infrared laser, a material which is transparent to infrared rays can be used as the constituent material of the base material 26.

Figure 3:
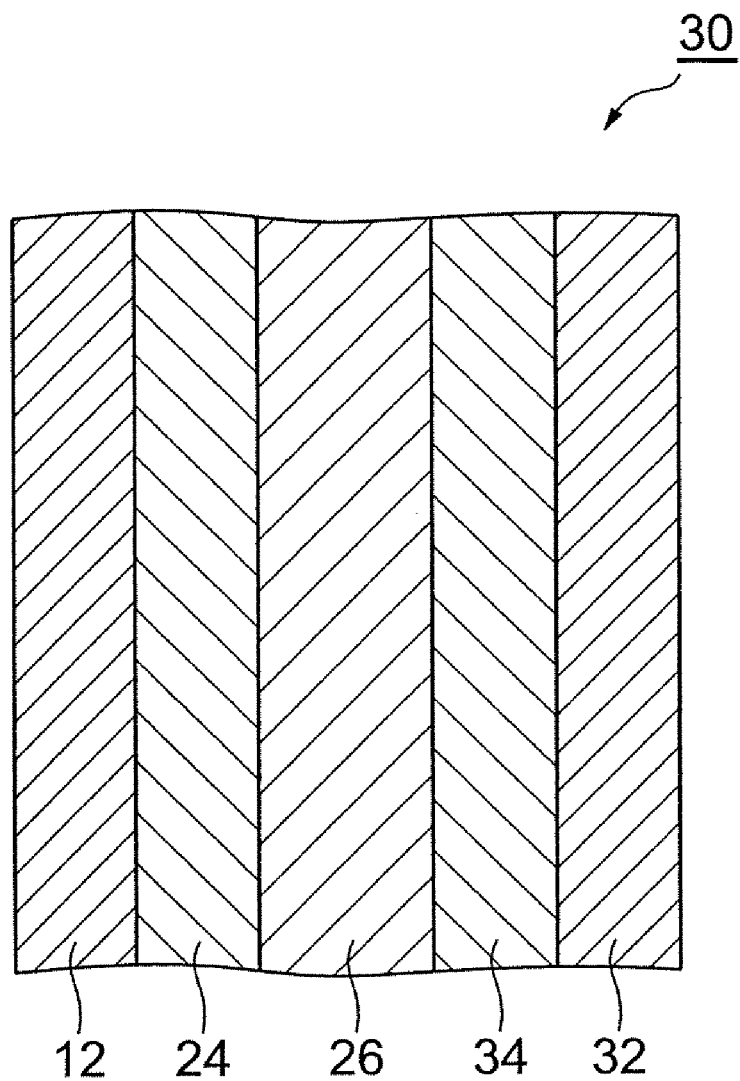
FIG. 3 is a schematic cross-sectional view of the vehicle antifouling element according to a third embodiment.

FIG. 3 is a schematic cross-sectional view of the vehicle antifouling element according to the preferred third embodiment of the present invention. The vehicle antifouling element 30 shown in FIG. 3 comprises a base material 26, a first thin film 24 and a third thin film 34 comprising a p-type semiconductor which are formed on both sides of the base material 26 and a second thin film 12 and fourth thin film 32 comprising an n-type semiconductor which are each laminated on the opposite side of the base material 26 from that of the first thin film 24 and third thin film 34. In the vehicle antifouling element 30, the base material 26, and first thin film 24 and second thin film 12 are the same as those of the second embodiment and, therefore, a description thereof will be omitted here.

As long as the constituent material of the third thin film 34 is a p-type semiconductor, there are no particular limitations on the constituent material. Possible examples for the constituent material may be the same as those for the first thin film 24. In addition, the film thickness of the third thin film 34 may be the same as that used for the first thin film 24. However, the constituent materials and film thicknesses of the first thin film 24 and third thin film 34 of the vehicle antifouling element 30 may be the same or may be different from one another.

The fourth thin film 32 has an n-type semiconductor constituent material and has a photocatalytic activity. The constituent material and film thickness used for the fourth thin film 32 can be the same as those for the second thin film 12. However, the constituent materials and film thicknesses of the second thin film 12 and fourth thin film 32 of the vehicle antifouling element 30 may be the same or may be different from one another.

The vehicle antifouling element 30 according to the third embodiment has the advantage that, when an optically transparent substrate is used for the base material 26, photocatalytic properties can be granted inside or outside the vehicle without disturbing the field of vision. Optically transparent substrates include substrates that are able to transmit visible light.

According to the first embodiment described hereinabove and according to the second and third embodiments in cases where a base material 26 of which the constituent material is transparent to visible light and ultraviolet light is employed, it is possible to apply the vehicle antifouling element to a transparent member such as an automobile window or lamp cover by adopting a p-type semiconductor constituent material of high transparency an example of which is NiO. According to these embodiments, by making the film thicknesses of thin film (second thin film) 12 and fourth thin film 32 equal to or more than 5 nm and less than 60 nm, the crack resistance can be improved. As a result, these films exhibit an adequate environmental resistance even when provided in a vehicle antifouling element that is used in various harsh environments and are able to maintain superior photocatalytic properties for long periods.

Figure 4:
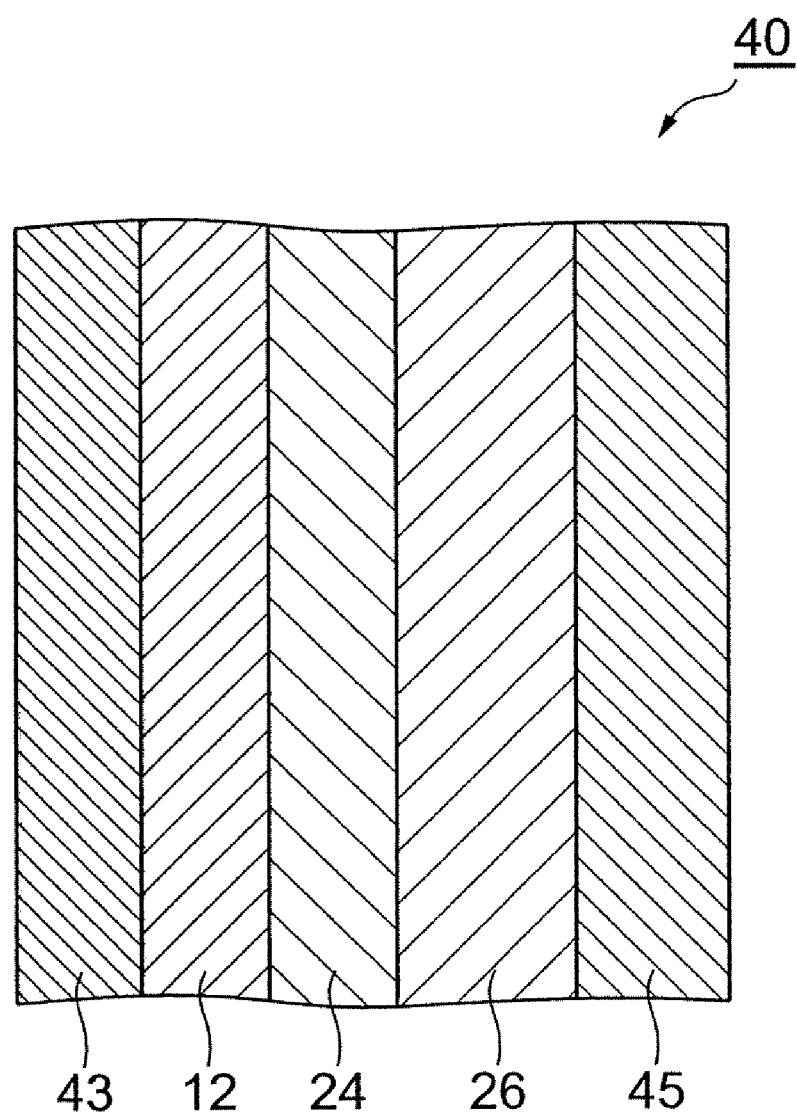
FIG. 4 is a schematic cross-sectional view of the vehicle antifouling element according to a fourth embodiment.

FIG. 4 is a schematic cross-sectional view of the vehicle antifouling element according to the preferred fourth embodiment of the present invention. The vehicle antifouling element 40 shown in FIG. 4 comprises base material 26, and, on the surface of the base material 26, a first thin film 24 comprising a p-type semiconductor, a second thin film 12 comprising an n-type semiconductor and a hydrophilic inorganic oxide film 43, these films being formed in that order starting from the side of the base material 26, and a reflective film 45 that is provided on the surface of the base material 26 on the opposite side from the first thin film 24. The vehicle antifouling element 40 functions as a mirror in which the surface of the inorganic oxide film 43 constitutes the light incidence side. In the vehicle antifouling element 40, the base material 26, first thin film 24, and second thin film 12 are the same as those used for the vehicle antifouling element according to the second embodiment and a description of the base material 26, first thin film 24, and second thin film 12 will therefore be omitted here.

The inorganic oxide film 43 is a film which is formed on the surface of the second thin film 12 which exhibits photocatalytic properties and, as a result of containing a hydrophilic material, exhibits extremely superior wettability (hydrophilicity) with respect to water droplets. The inorganic oxide film 43 is preferably porous at least close to the surface in order to obtain reliably favorable hydrophilicity. As long as the hydrophilic material has superior wettability, there are not particular limitations on the hydrophilic material and same may be a porous inorganic oxide. Examples of hydrophilic material include silicon dioxide ($SiO_2$) and a mixture of borium trioxide ($B_2O_3$) and silicon dioxide, but the hydrophilic material is preferably silicon dioxide ($SiO_2$).

The inorganic oxide film 43 may contain hydrophilic material to the extent that the inorganic oxide film 43 possesses hydrophilicity and, from the perspective of favorably exhibiting the hydrophilic function, preferably contains hydrophilic material as the main component and, more preferably, comprises hydrophilic material.

The film thickness of the inorganic oxide film 43 is preferably from 2 to 30 nm from the perspective of more adequately exhibiting the photocatalytic action of the second thin film 12.

The reflective film 45 is a reflective film that contains metal that is formed on the surface of the base material 26. The constituent material of the reflective film 45 may be suitably selected in combination with the film thickness of the first thin film 24, the second thin film 12 and the inorganic oxide film 43 such that the reflected light of the vehicle antifouling element 40 that functions as a mirror has the desired reflectance spectral or may be an individual metal, an alloy, or a steel containing a small quantity of carbon. Specific examples include metals of one or more types selected from the group containing aluminum (Al), titanium (Ti), chromium (Cr), nickel (Ni), niobium (Nb), molybdenum (Mo), palladium (Pd), silver (Ag), and platinum (Pt), or stainless steel.

Of the above metals, from the perspective of improving the chemical resistance and corrosion resistance, metals of one or more types selected from the group containing titanium, chromium, nickel, niobium, molybdenum, palladium, and platinum are preferable.

The reflective film 45 may be formed by laminating a plurality of metallic films of different materials or may be formed by laminating a plurality of metallic films which are formed using different lamination levels.

The film thickness of the reflective film 45 is preferably 30 to 80 nm and more preferably 50 to 70 nm. When the lower limit value of the film thickness is lowered, the vehicle antifouling element 40 has the tendency to readily become a half mirror. So too when the film thickness exceeds the upper limit value, because there is barely any change in the reflectance, the material costs and production costs only grow excessively high.

According to the fourth embodiment, the vehicle antifouling element 40 is able to exhibit superior antifogging properties because the water droplets that adhere to the surface of the vehicle antifouling element 40 spread out like a thin film as a result of the hydrophilicity of the inorganic oxide film 43. In addition, even in cases where organic contaminants, which lowers the hydrophilic function, has adhered to the surface of the vehicle antifouling element 40, the organic contaminants that have adhered thereto are decomposed as a result of the photocatalytic action of the second thin film 12. As a result, the reduction of the hydrophilic function of the inorganic oxide film 43 can be adequately suppressed and the superior antifogging properties can be maintained for long periods. In other words, the vehicle antifouling element 40 can be employed as a maintenance-free reflective mirror.

In addition, the vehicle antifouling element 40 exhibits sufficiently superior crack resistance due to the fact that the film thickness of the second thin film 12 is equal to or more than 5 nm and less than 60 nm. Hence, the adequate environmental resistance is exhibited even when provided in a vehicle antifouling element which is used under harsh environmental conditions such as high temperature, low temperature, and high humidity, for example. Based on the adequate environmental resistance and the antifogging properties and antifouling properties, the vehicle antifouling element 40 is able to exhibit highly superior durability.

The vehicle antifouling element 40 is preferably used as the mirror portion of an external mirror and exterior rear view mirror which are provided in an automobile, for example. These are readily exposed to rain and contamination and are used under harsh environmental conditions such as high temperature, low temperature, and high humidity. Hence, the external mirror or exterior rear view mirror which comprises the vehicle antifouling element 40 is able to more effectively exhibit the superior antifogging properties, antifouling properties and environmental resistance of the vehicle antifouling element 40.

The method of fabricating a vehicle antifouling element will be described next by taking the vehicle antifouling element 40 of the fourth embodiment as an example. According to this fabrication method, a cleaned base material 26 is first prepared. The reflective film 45 is then suitably formed on the surface of one side of the base material 26 by means of a dry-forming method such as the widely known vacuum evaporation deposition method or sputtering deposition method. Thereafter, the first thin film 24 is suitably formed on the other surface of the base material 26 by means of a dry-forming method such as the widely known vacuum evaporation deposition method or sputtering deposition method.

Thereafter, the second thin film 12 is formed on the surface of the first thin film 24 by means of wet forming method such as the widely known sol-gel method or by means of a dry forming method such as the widely known vacuum evaporation deposition method or sputtering deposition method. The inorganic oxide film 43 is suitably formed on the surface of the second thin film 12 by means of the widely known vacuum evaporation deposition method or sputtering deposition method or the like, whereby the vehicle antifouling element 40 is obtained. In cases where each of these films comprises two or more materials, the raw-material pellet or sputtering target may comprise two or more materials. Alternatively, these films may also be formed by means of codeposition by using a plurality of individual pellets or sputtering targets of individual materials.

The preferred embodiments of the present invention were described hereinabove but the present invention is not limited to these embodiments alone. A variety of modifications are possible within the spirit of the present invention.

For example, the first, second and third embodiments of the present invention may further comprise a hydrophilic inorganic oxide film on the surface of the thin film (second thin film) 12 and/or fourth thin film 32. The inorganic oxide film may also have the same constituent material and film thickness as the inorganic oxide film 43 of the fourth embodiment.

EXAMPLES

The present invention will be described in detail hereinbelow by means of examples. The present invention is not limited to these examples.

Example 1

First, a p-type single-crystal silicon wafer was prepared as a first thin film that also served as the base material. The crystal plane of the main surface of this silicon wafer was (100) and the thickness thereof was 0.5 mm. The thin film comprising titanium dioxide which constitutes the second thin film was formed on the main surface of the silicon wafer by means of DC magnetron sputtering deposition method so that the film thickness was 5 nm. The formation conditions were target material: titanium metal, gas type: $Ar/O_2=1/1$ (pressure ratio), gas pressure: 5 Pa, input DC power: 100 W, and substrate temperature: 315° C. Thus, an antifouling element formed by laminating the first and second thin films was obtained.

Example 2

An antifouling element was obtained that was the same as that of Example 1 besides the fact that rather than the crystal plane of the main surface of the p-type single-crystal silicon wafer that was prepared as the first thin film being (100), the crystal plane of the main surface was plane (110).

Example 3

An antifouling element was obtained that was the same as that of Example 1 besides the fact that rather than the crystal plane of the main surface of the p-type single-crystal silicon wafer that was prepared as the first thin film being (100), the crystal plane of the main surface was plane (111).

Example 4

First, a thin film comprising nickel oxide was formed with a film thickness of 5 nm as the first thin film by means of the DC magnetron sputtering deposition method on the surface of a soda-lime glass base material. The formation conditions were as follows: target material: nickel metal, gas type: $O_2$, gas pressure: 5 Pa, input DC power: 100 W, substrate temperature: room temperature. Thereafter, a thin film comprising titanium dioxide which was the second thin film was formed with a film thickness of 50 nm by means of the DC magnetron sputtering deposition method on the surface of the first thin film. The formation conditions were as follows: target material: titanium metal, gas type: $Ar/O_2=1/1$ (pressure ratio), gas pressure: 5 Pa, input DC power: 100 W, substrate temperature: room temperature. Thus, an antifouling element formed by laminating the first thin film and second thin film in that order on the glass base material was obtained.

Comparative Example 1

First, an n-type single-crystal silicon wafer was prepared as a thin film that also serves as the base material. The crystal plane of the main surface of this silicon wafer was plane (100) and the thickness thereof was 0.5 mm. Thereafter, the thin film comprising titanium dioxide which is the second thin film was formed with a film thickness of 5 nm on the main surface of the silicon wafer by means of the DC magnetron sputtering deposition method. The formation conditions were as follows: target material: titanium metal, gas type: $Ar/O_2=1/1$ (pressure ratio), gas pressure: 5 Pa, input DC power: 100 W, substrate temperature: 315° C. Thus, an antifouling element formed by laminating a second film on an n-type single-crystal silicon wafer was obtained.

Comparative Example 2

A thin film comprising titanium dioxide was formed with a film thickness of 50 nm on the surface of the quartz glass base material by means of the DC magnetron sputtering deposition method. The formation conditions were as follows: target material: titanium metal, gas type: $Ar/O_2=1/1$ (pressure ratio), gas pressure: 5 Pa, input DC power: 100 W, substrate temperature: room temperature. Thus, an antifouling element formed by laminating a thin film comprising titanium dioxide on a glass base material was obtained.

Comparative Example 3

First, a thin film comprising zirconium oxide ($ZrO_2$) was formed with a film thickness of 5 nm on the surface of the quartz glass base material by means of the DC magnetron sputtering deposition method. The formation conditions were as follows: target material: zirconium metal, gas type: $O_2$, gas pressure: 1 Pa, input DC power: 300 W, substrate temperature: room temperature. Thereafter, a thin film comprising titanium dioxide was formed with a film thickness of 5 nm on the surface of thin film comprising $ZrO_2$ by means of the DC magnetron sputtering deposition method. The formation conditions were as follows: target material: titanium metal, gas type: $O_2$, gas pressure: 1 Pa, input DC power: 300 W, substrate temperature: room temperature. Thus, an antifouling element formed by laminating a thin film comprising zirconium oxide and a thin film comprising titanium dioxide in that order on a glass base material was obtained.

Comparative Example 4

An antifouling element formed by laminating a thin film comprising titanium dioxide on a glass base material was obtained as per Comparative Example 3 except for the fact that a thin film comprising zirconium oxide was not formed but rather a thin film comprising titanium dioxide was formed directly on the surface of the quartz glass base material.

Comparative Example 5

An antifouling element formed by laminating a thin film comprising titanium dioxide on a glass base material was obtained as per Example 1 except for the fact that a soda-lime glass base material was used instead of a p-type single-crystal silicon wafer whose main surface crystal plane was (100).

[Evaluation 1 of Photocatalytic Activity (Antifouling Properties)]

Figure 5:
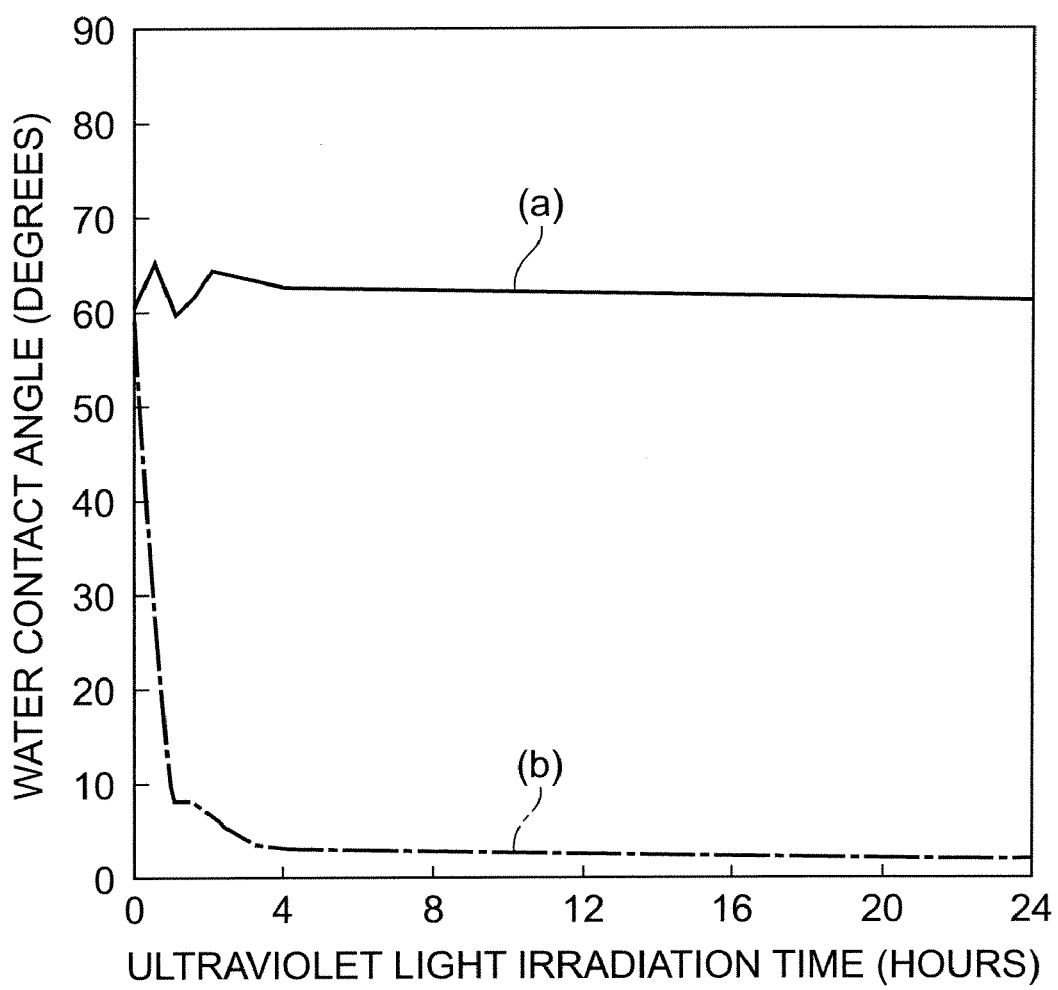
FIG. 5 is a graph showing changes with elapsed time in the water contact angle when an antifouling element is irradiated continuously with ultraviolet light.

Fouling was performed by thinly applying oil to the whole of the titanium dioxide surface of the antifouling element obtained. Thereafter, ultraviolet light (black light, irradiation intensity: $1.0\pm10.2$ W/cm$^2$) were irradiated onto the surface to which oil had been applied. Following the start of irradiation, water droplets were dropped as necessary onto the surface irradiated with ultraviolet light and the water contact angle was measured. The time required for the water contact angle to be equal to or less than 10° was measured. The results are shown in Table 1. Further, the change with respect to time in the water contact angle is shown for Example 1 and Comparative Example 1 in FIG. 5. (a) of FIG. 5 is Comparative Example 1 and (b) pertains to Example 1. In cases where the water contact angle was not equal to or less than 10° even when irradiation with ultraviolet light was performed for 24 hours, '>24' was shown. Furthermore, a case where the water contact angle was not equal to or less than 10° even when there was no fouling with oil and irradiation with ultraviolet light was carried out was shown as '- - -'.

TABLE 1

|  | Evaluation 1 of Photocatalytic activity (time) |
|---|---|
| Example 1 | 1 |
| Example 2 | 1.5 |
| Example 3 | 1 |
| Example 4 | 15 |
| Comparative Example 1 | >24 |
| Comparative Example 2 | >24 |
| Comparative Example 3 | >24 |
| Comparative Example 4 | — |
| Comparative Example 5 | >24 |

What is claimed is:

1. A vehicle antifouling element, comprising:
   a substrate comprising one of a glass and a metal sheet;
   a p-type semiconductor layer comprising a p-type semiconductor and formed on the substrate; and
   a thin film comprising an n-type semiconductor and formed on the substrate and the p-type semiconductor layer, the thin film being laminated on a surface of the p-type semiconductor layer on an opposite side of the substrate,
   wherein the n-type semiconductor of the thin film comprises a photocatalyst material which has a photocatalytic activity and the film thickness of the thin film is equal to or more than 5 nm and equal to or less than 60 nm.

2. The vehicle antifouling element according to claim 1, wherein the photocatalyst material of the n-type semiconductor is titanium dioxide.

3. The vehicle antifouling element according to claim 2, wherein the p-type semiconductor comprises a material which does not exhibit photodissolution.

4. The vehicle antifouling element according to claim 3, further comprising a hydrophilic inorganic oxide film laminated on a surface of the thin film on an opposite side from the p-type semiconductor layer.

5. The vehicle antifouling element according to claim 2, further comprising a hydrophilic inorganic oxide film laminated on a surface of the thin film on an opposite side from the p-type semiconductor layer.

6. The vehicle antifouling element according to claim 1, wherein the p-type semiconductor comprises a material which does not exhibit photodissolution.

7. The vehicle antifouling element according to claim 6, further comprising a hydrophilic inorganic oxide film laminated on a surface of the thin film on an opposite side from the p-type semiconductor layer.

8. The vehicle antifouling element according to claim 1, further comprising a hydrophilic inorganic oxide film laminated on a surface of the thin film on an opposite side from the p-type semiconductor layer.

9. The vehicle antifouling element according to claim 1, wherein the photocatalyst material of the n-type semiconductor comprises a compound selected from the group consisting of $TiO_2$, $SrTiO_3$, $WO_3$, $NbO$, $In_2O_3$, $Ta_2O_5$ and $SnO_2$.

10. The vehicle antifouling element according to claim 1, wherein the photocatalyst material of the n-type semiconductor comprises a compound selected from the group consisting of $TiO_2$, $SrTiO_3$ and $WO_3$.

11. The vehicle antifouling element according to claim 1, further comprising a hydrophilic inorganic oxide film laminated on a surface of the thin film on an opposite side from the p-type semiconductor layer, and the hydrophilic inorganic oxide film comprises $SiO_2$.

12. The vehicle antifouling element according to claim 1, further comprising a hydrophilic inorganic oxide film laminated on a surface of the thin film on an opposite side from the p-type semiconductor layer, and the hydrophilic inorganic oxide film comprises $SiO_2$ and $B_2O_3$.

13. The vehicle antifouling element according to claim 1, wherein the substrate is made of the glass.

14. The vehicle antifouling element according to claim 1, wherein the substrate is made of the metal sheet, and the metal sheet comprises one of stainless steel and titanium.

15. The vehicle antifouling element according to claim 1, further comprising a reflective film formed on the substrate on an opposite side of the p-type semiconductor layer.

* * * * *